United States Patent
Mele et al.

(10) Patent No.: US 11,604,292 B2
(45) Date of Patent: Mar. 14, 2023

(54) CHARGE PREAMPLIFIER DEVICE AND RADIATION DETECTING APPARATUS COMPRISING THE DEVICE

(71) Applicant: Politecnico Di Milano, Milan (IT)

(72) Inventors: Filippo Mele, Como (IT); Giuseppe Bertuccio, Como (IT)

(73) Assignee: Politecnico di Milano, Milan (IT)

( * ) Notice: Subject to any disclaimer, the term of this patent is extended or adjusted under 35 U.S.C. 154(b) by 0 days.

(21) Appl. No.: 17/297,815

(22) PCT Filed: Nov. 19, 2019

(86) PCT No.: PCT/IB2019/059931
§ 371 (c)(1),
(2) Date: May 27, 2021

(87) PCT Pub. No.: WO2020/109924
PCT Pub. Date: Jun. 4, 2020

(65) Prior Publication Data
US 2021/0396893 A1  Dec. 23, 2021

(30) Foreign Application Priority Data
Nov. 29, 2018  (IT) .................. 102018000010671

(51) Int. Cl.
*H03F 3/70* (2006.01)
*G01T 1/24* (2006.01)
*H03F 3/45* (2006.01)

(52) U.S. Cl.
CPC ............... *G01T 1/247* (2013.01); *H03F 3/70* (2013.01); *H03F 2200/372* (2013.01)

(58) Field of Classification Search
CPC ... G01T 1/247; G01T 1/24; H03F 3/70; H03F 2200/372; H03F 1/083; H03F 1/26; H03F 3/087; H03F 3/45475

(Continued)

(56) References Cited

U.S. PATENT DOCUMENTS 4,211,941 A  7/1980  Schade
6,484,054 B2  11/2002  Weijand et al.
(Continued)

FOREIGN PATENT DOCUMENTS

WO  2012156748 A1  11/2012

OTHER PUBLICATIONS

International Search Report; European Patent Office; International Patent Application No. PCT/IB2019/059931; dated Feb. 19, 2020; 6 pages.

(Continued)

*Primary Examiner* — Hieu P Nguyen
(74) *Attorney, Agent, or Firm* — Taft Stettinius & Hollister LLP

(57) ABSTRACT

It is described a charge preamplifier device (100) integrated in a chip (200) of semiconductive material comprising: an input (IN) for an input signal ($i_{IN}$) and an output (OUT) for an output signal ($v_{OUT}$); a substrate (202) of semiconductive material doped according to a first type of conductivity; an electrically insulating layer (204) placed on said substrate (202); a feedback capacitor ($C_f$) integrated in the chip (200) and comprising a first electrode (3) connected to the input (IN) and a second electrode (2) connected to the output (OUT). The second electrode (2) is formed by a doped conductive region (205) having a second type of conductivity, opposite to the first type of conductivity, and integrated in the substrate (202) in order to face the first electrode (3).

14 Claims, 2 Drawing Sheets

(58) Field of Classification Search
USPC .................................. 330/252–261, 307, 291
See application file for complete search history.

(56) References Cited

U.S. PATENT DOCUMENTS

| | | | |
|---|---|---|---|
| 9,397,626 B2* | 7/2016 | Nashashibi | ............... H03F 3/70 |
| 9,768,737 B2* | 9/2017 | Fiorini | ..................... H03F 3/70 |
| 2002/0113287 A1 | 8/2002 | Lee et al. | |
| 2018/0006613 A1 | 1/2018 | Fiorini et al. | |

OTHER PUBLICATIONS

Written Opinion of the International Searching Authority; European Patent Office; International Patent Application No. PCT/IB2019/059931; dated Feb. 19, 2020; 7 pages.

\* cited by examiner

CHARGE PREAMPLIFIER DEVICE AND RADIATION DETECTING APPARATUS COMPRISING THE DEVICE

CROSS-REFERENCE TO RELATED APPLICATIONS

This application is a U.S. National Phase of International PCT Application No. PCT/M2019/059931 filed on Nov. 19, 2019, which claims priority to Italian Patent Application No. 102018000010671 filed Nov. 29, 2018, each of which are incorporated herein by reference in their entirety.

TECHNICAL FIELD

The present invention refers to charge preamplifiers and radiation detecting apparatuses using a charge preamplifier.

STATE OF THE ART

As it is known, the charge amplifier (aka Charge Sensitive Amplifier, CSA) can be seen as a low noise operational amplifier having a feedback capacitance placed between the input and output of the amplifier itself, and such to operate as an integrator of a current signal at its input.

In conventional applications, the charge amplifier is used in radiation measuring apparatuses and, consequently, is fed at the input by the current signal generated by a radiation sensor. When a radiation passes through such sensor, it generates a charge signal proportional to the energy of the absorbed radiation. Typically, the charge amount generated by these sensors, for example a X ray sensor, is substantially limited (from hundreds to few tenths of thousands of electrons). The charge preamplifier is fed, at the input, by this charge signal and converts it into a voltage signal. Such voltage signal is used by further processing stages, in order to generate, for example, an energy spectrum and/or a time radiation distribution.

It is observed the noise generated by the operational amplifier is represented at the input as a voltage or current equivalent noise generator, generating an equivalent noise charge (ENC), proportional to the total capacitance at the input of the preamplifier comprising, among them, the input capacitance of the preamplifier $C_{in}$ itself.

In this regard, the document E. Gatti, P. F. Manfredi, M. Sampietro, V. Speziali, "Suboptimal filtering of 1/f-noise in detector charge measurements", Nuclear Instruments and Methods in Physics Research Section A: Accelerators, Spectrometers, Detectors and Associated Equipment"; volume 297, 3rd Edition 1990, pp. 467-478, ISSN 0168-9002, https://doi.org/10.1016/0168-9002(90)91331-5 describes some noise processing modes in charge detectors.

Therefore, a decrease of the input capacitance $C_{in}$ of the charge preamplifier causes ENC to decrease of, and consequently an improvement of the signal/noise ratio and of the energy or time resolution of the measuring apparatus.

In more sophisticated arrangements, the charge preamplifier is an integrated circuit (IC) made on a ("p" or "n" doped) semiconductor substrate. The preamplifier input is connected to the output of the sensor by a bonding wire. The bonding wire is connected to the input of the preamplifier by a conductive pad which should be sufficiently large to enable an interconnection operation, and to ensure a mechanical gripping strength. Therefore, such conductive pad is directly or indirectly connected to the amplifier input by a specific metallization, to which the first electrode of the feedback capacitance, formed by a conductive plate (of metal or polysilicon) is connected.

The second electrode of the feedback capacitance consists of a second conductive plate placed in proximity of the first electrode and insulated from the substrate by an insulating film. The second electrode is connected to the amplifier output by a metal connection, in order to obtain a capacitive feedback. With reference to the prior art, this type of implementation is for example described in document US-A-2018/0006613 (FIG. 3).

In this conventional structure, the input pad forms also the first electrode of a parasitic capacitance $C_{pad}$ at the input of the amplifier, the second electrode thereof consists of the substrate of the integrated circuit. Since the parasitic capacitance $C_{pad}$ is a substantial component of the input capacitance $C_{in}$ of the preamplifier, it should be reduced in order to decrease the ENC.

The following documents of the prior art discuss the problems regarding the noise in CMOS technology charge preamplifiers:

P. O'Connor, G. Gramegna, P. Rehak, F. Corsi, C. Marzocca, "CMOS Preamplifier with High Linearity and Ultra Low Noise for X-Ray Spectroscopy", IEEE Trans. Nucl. Sci., vol. 44, pp. 318-325, June 1997.

G. Bertuccio, S. Caccia, "Noise Minimization of MOSFET Input Charge Amplifiers based on ΔN and Δμ 1/f Models", IEEE Transactions on Nuclear Science, Vol. 56, no. 3, 2009, pp. 1511-1520.

In addition, document US-A-2018/0006613 describes an integrated charge preamplifier having a conductive layer placed below the input pad (or part of it) for making one of the electrodes of the feedback capacitance. Such conductive layer is made above an insulating layer placed on the substrate, in order to keep the electric insulation between the amplifier output and substrate.

The Applicant has observed that this solution does not seem satisfying with reference to a reduction of the parasitic capacitance and consequently of the equivalent noise charge, ENC.

Document U.S. Pat. No. 6,484,054 describes deep trench semiconductor capacitors having reverse bias diodes to be employed in implantable medical devices.

Document U.S. Pat. No. 4,211,941 describes an integrated circuit including low-leakage capacitance.

Document WO2012/156748 charge pre-amplifier including a field effect transistor.

SUMMARY OF THE INVENTION

The present invention addresses the problem of providing a charge preamplifier, integrated in a chip of semi-conductive material, of a type different from the known ones and which, according to a particular aspect, has a smaller input capacitance than the one obtainable according to the solutions of the above cited prior art, with a consequent improvement of the equivalent noise charge, ENC.

The Applicant has observed that a charge preamplifier integrated in a semi-conductive material chip, alternative to the known ones, can be obtained by making a feedback capacitor comprising an electrode, connected to the output of the preamplifier device, formed by a doped conductive well integrated in the substrate of the semi-conductive chip and having a conductivity opposite to the one of the substrate. This way of implementing an electrode of the feedback capacitance enables to obtain, if such well at least partially faces the input pad, a charge preamplifier with an input capacitance less than the one of the prior art devices.

According to an aspect, the object of the present invention is a charge preamplifier integrated in a chip of semi-conductive material as described in claim 1, and preferred embodiments thereof as defined in claims from 2 to 13.

The object of the present invention is also a detecting apparatus as described in claim 14 and a particular embodiment thereof defined in claim 15.

BRIEF DESCRIPTION OF THE DRAWINGS

The present invention will be particularly described in the following in an exemplifying nonlimiting way, with reference to the attached drawings, in which.

DETAILED DESCRIPTION

Figure 1:
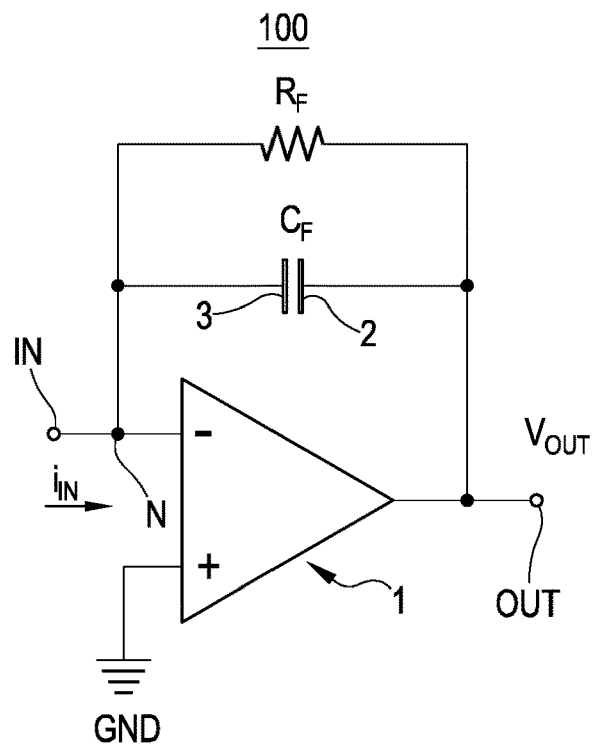
FIG. 1 shows the circuital scheme of a charge preamplifier comprising an operational amplifier and a feedback capacitance.

Even though the invention can be implemented by several alternative variants and arrangements, some particular embodiments thereof are shown in the drawings and will be particularly described in the following. In the present description, analogous or identical elements or components will be indicated in the figures by the same identifying symbol.

FIG. 1 shows, according to an example, the circuital scheme of a charge preamplifier 100 comprising an operational amplifier 1 and a feedback capacitor $C_f$. According to the shown example, the operational amplifier 1 is a low noise operational amplifier and comprises an input IN connected to a node N, in turn connected to an input terminal of the operational amplifier 1 (e.g.: a relative inverting terminal "−") and an output terminal OUT. The operational amplifier 1 has a further input terminal, for example the non-inverting terminal "+" connected to a ground terminal GND.

The feedback capacitor $C_f$ is connected between the output terminal OUT and node N, connected to the input terminal IN. A feedback resistance $R_f$, parallel connected to the feedback capacitor, represents for example a discharge path of the feedback capacitor in a continuous resetting architecture, or an equivalent resistance of a reset switch in pulsed resetting architectures. Particularly, the capacitor $C_f$ has a first electrode 3 connected to the input IN by the node N and a second electrode 2 connected to the output OUT.

The charge preamplifier 100 operates as an integrator capable of integrating a current signal $i_{IN}$ present at the input IN by providing at the output OUT a voltage signal $v_{OUT}$ having an amplitude proportional to the electric charge at the input IN.

The charge preamplifier 100 can be implemented in a semi-conductive material chip according to the CMOS (Complementary-Metal-Oxide Semiconductor) technology, or according to the BiCMOS (Bipolar Complementary Metal-Oxide Semiconductor) technology or according to the BCD (bipolar-CMOS-DMOS) technology. The DMOS technology comprises the Vertical Diffused MOS (VDMOS) and Lateral Diffused MOS (LDMOS) technologies.

Figure 2:
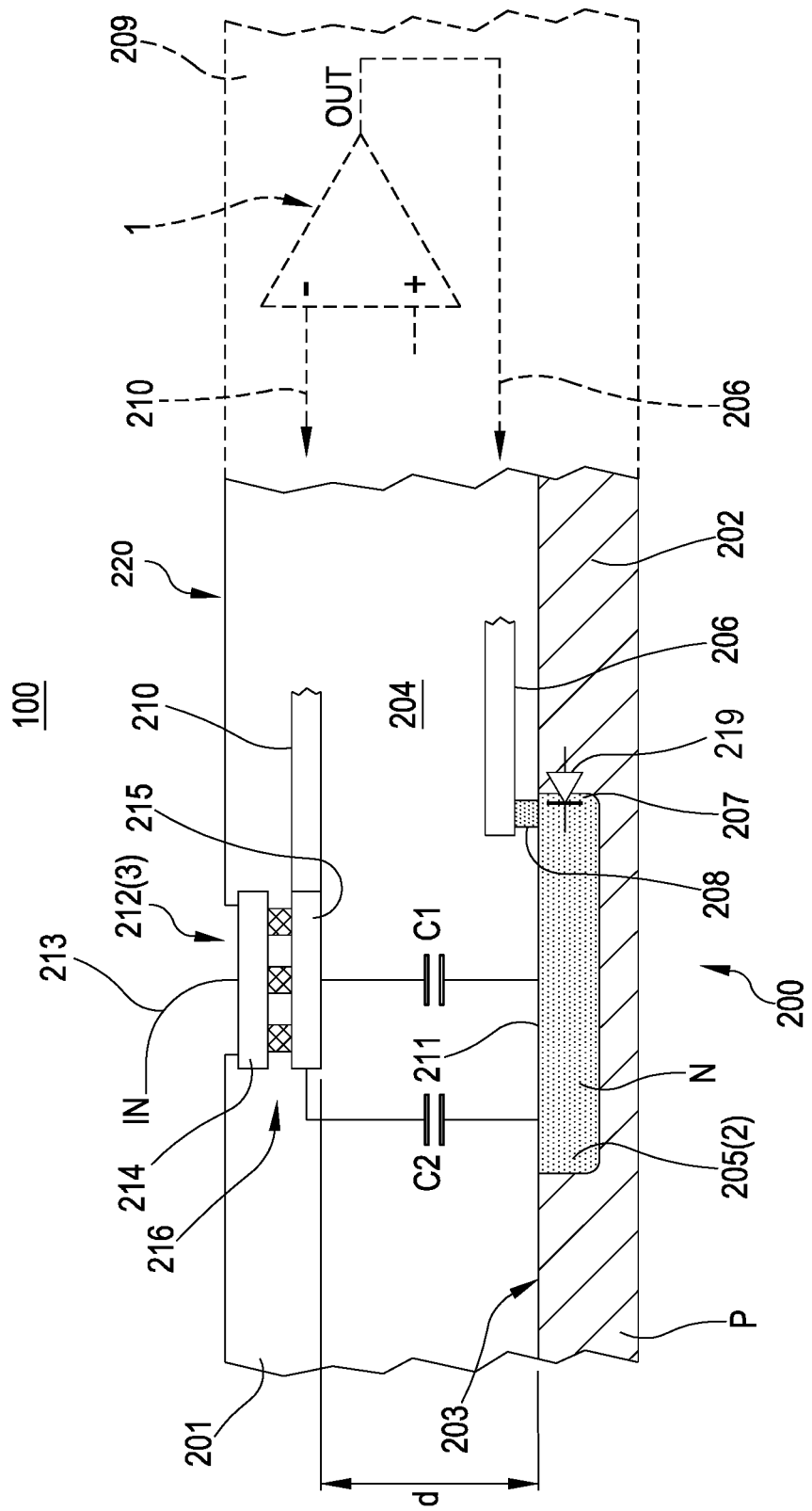
FIG. 2 shows a cross-section of a chip of semi-conductive material in which said charge preamplifier is integrated.

FIG. 2 illustrates (with a vertical cross-section) a semi-conductive material chip 200 in which the amplifier 100 is integrated. Particularly, in a first portion 201 of the chip 200 some components of the amplifier 100 are integrated (by the CMOS technology), among them the feedback capacitor $C_f$ is integrated. The amplifier 1 is integrated in a second portion 209 of the chip 200, which is only schematically shown in FIG. 2, because its implementation is known to a person skilled in the art and its implementation can vary according to the applicative requirements.

Chip 200 comprises a substrate 202 of semiconductive material doped with a first type of conductivity. For example, the substrate 202 is made of silicon, and is of a p-type conductivity and defines an internal surface 203.

A well 205 doped with a second type of conductivity, opposed to the first type one, is made inside the silicon substrate 202. According to the example, a n-type well is made. The well 205 extends from the inside of the substrate 202 and defines a further surface 211 placed at the level of the internal surface 203. The well 205, from a circuit point of view, is the second electrode 2 of the feedback capacitor $C_f$. The typical doping of the well 205 is comprised between $10^{14}$ and $10^{16}$ cm$^{-3}$.

A layer 204 of an electrically insulating material, such as for example a layer of $SiO_2$, is placed on the internal surface 203 of the substrate 202 and on the well 205.

For example, the $SiO_2$ layer 204 has a thickness comprised between 1 μm and 10 μm.

It is observed the well 205 is connected to the output OUT of the amplifier 1. Particularly, a first interconnecting layer 206 made of a metal material or polysilicon is provided inside the $SiO_2$ layer. The first interconnecting layer 206 has an end connected to a lateral zone 207 of the well 205 by a first contact element 208. Such first contact element 208 comprises, for example, an area doped with a material of a n-type conductivity, extending from the first interconnecting layer 206 to the well 205 along a direction normal to the one defined by the semiconductor material substrate 202. Another end of the interconnecting layer 206 is connected to the output OUT of the preamplifier 100. Particularly, the first interconnecting layer 206 has a thread-like shape (with a square or rectangular cross-section) and for example has a width (along the direction normal to the one defined by the plane of FIG. 2) equal to about 1 μm.

In addition, the chip 200 is provided with a connecting conductive pad 212 at the input IN of the preamplifier 100 made in proximity of a surface of the chip 211 (e.g. a passivation layer) of the electrically insulating layer 204, opposite to the one contacting the semiconductive substrate 202. Such pad 212 is at least partially integrated in the insulating material layer 204 and is connected to a conductor 213, such as a bonding wire, which can form the input IN of the preamplifier. As an alternative to the bonding wire, a bump-bonding connection can be used. Preferably, the bonding wire 213 is welded to the pad 212.

The pad 212 comprises at least one first conductive layer 214 (for example of metal) but which can be also provided, as shown in figure, with a second conductive layer 215 electrically connected to the first conductive layer 214 by second contact elements (known also as via-holes or holes) 216 made of conductive material, typically of metal. The size of the second conductive layer 215 is identical or analogous to the one of the first conductive layer 214 and faces this latter, inside the electrically insulating layer 204. Moreover, the pad 212 can comprise more than two conductive layers 215 facing and connected to each other.

Moreover, the chip 200 includes at least one second interconnecting layer 210 particularly made of a conductive material such as, for example, aluminum or another metal material. The second interconnecting layer 210 has a portion connected to the pad 212, and another portion connected to the inverting terminal "−" of the amplifier 1. Particularly, the second interconnecting layer 210 is connected to the second conductive layer 215 (for example, is part of the same metallization layer) and extends parallel to this latter but has a thread-like shape analogous to the one of the first interconnecting layer 206.

The charge preamplifier 100 integrated in the chip 200 can be made, for example, in order to have a plan view analogous to the one shown in FIG. 5 of document US2018-A-0006613.

In operation, the junction formed by the (p-type) semiconductive substrate 202 and (n-type) well 205 is inversely biased under the condition in which the output voltage $v_{OUT}$ remains greater than or equal to the voltage of the semiconductive substrate 202. In this inverted junction (illustratively shown in FIG. 2 by a p-n diode 219), due to the development of a depression area at the p-n junction, an electric insulation is formed between the substrate 202 and well 205 connected to the output OUT of the amplifier 1.

According to a preferred embodiment, the pad 212 faces the well 205 and extends parallel to such well. Advantageously, the well 205 defines a surface 211 larger than or equal to the area of the orthogonal projection on the substrate 202 of the pad 212. Particularly, the dimensions of the well 205 are equal to or slightly greater than the ones of the pad 212 e.g., for example, than the ones of the first conductive layer 214. In other words, the well 205 includes the projection area of the pad 212 on the substrate 202. The pad 212 is spaced from the well 205 and is separated from the well itself by the material of the electrically insulating layer 204 forming a dielectric material. According to this preferred embodiment, the feedback capacitor $C_f$ is formed by the first electrode 3 (made by the pad 212), by the second electrode 2 (made by the well 205), and by the portion of the electrically insulating layer 204 interposed between them.

Preferably, the values of the feedback capacitance $C_f$ range for example from 1 fF and to 10 pF.

For example, the distance between the well 205 and a lower face of the pad 212 is comprised between 1 μm and 10 μm.

It is observed the above described feedback capacitor $C_f$ has a capacitance (also indicated by Cd including a capacitive component C1 (schematically shown in FIG. 2 by a capacitor C1) which is proportional to the pad 212 area and is generated by the orthogonal component of the electric field present between the pad 212 and the well 205.

According to a particular embodiment, the well 205 is made in the substrate 202 so that it extends (as also shown in FIG. 2) besides the orthogonal projection of the pad 212 on the substrate 202 itself, with an area sufficient to intercept the edge electric field lines which, originating from the pad 212 edge, form a perimetral component of the parasitic capacitance of the pad 212.

Consequently, the capacitance of the feedback capacitor $C_f$ includes also a second component C2 (illustratively indicated in FIG. 2 by a capacitor C2) proportional to the pad 212 perimeter and generated by the edge component of the electric field present between the pad 212 and well 205. Therefore, in this case, the feedback capacitor $C_f$ has a capacitance given by summing the first component C1 to the second component C2.

Therefore, while in a charge preamplifier made according to the traditional techniques the capacitance associated to the input pad is a parasitic capacitance causing an equivalent noise charge, in the above given description the capacitance associated to the pad 212 is used for obtaining the feed capacitance $C_f$.

It is observed the embodiment hereinbefore described with reference to FIGS. 1 and 2 is also advantageous with respect to the one implemented in the device of document US2018-A-0006613. Indeed, as hereinbefore discussed, the device of document US2018-A-0006613 has a conductive layer placed below the input pad (or part of it) for obtaining the feedback capacitance. Such conductive layer is made above an insulating layer placed above or made inside the chip substrate, in order to keep the electric insulation between the output of the amplifier and the substrate. The main disadvantage of this configuration of the prior art consists of depositing the insulating layer and conductive layer above the substrate, this determines a higher feedback capacitance than the parasitic capacitance generated by the pad in the conventional devices.

Indeed, the capacitance is inversely proportional to the distance between the conductive plates containing the electric field and, in the configuration shown in document US2018-A-0006613, the presence of the insulating layer and conductive layer, cause an unavoidable reduction of such distance, and a consequent increase of the pad parasitic capacitance (converted into a feedback capacitance) and therefore an increase of the total capacitance at the input node of the preamplifier.

On the contrary, in the described solution regarding FIGS. 1 and 2, the pad 212 parasitic capacitance is not increased since the arrangement of the well 205 prevents the two electrodes 2 and 3 enclosing the electric field from approaching each other. This enables to minimize the input capacitance of the amplifier 1 with a consequent improvement of the performance.

In addition, it is observed the herein described solution, for the same dimensions of the pad, enables to obtain values of the feedback capacitance $C_f$ less than the ones obtainable according to the above discussed prior art document. Since the transform gain of the preamplifier 100, defined as the ratio of the charged injected at the input IN to the voltage $v_{OUT}$ at the output OUT, is inversely proportional to the feedback capacitance $C_f$, the decrease of the capacitance $C_f$ entails an increase of such gain, enabling a more substantial decrease of the noise generated by the following stages of the signal processing chain.

A further advantage offered by the present solution is the possibility, for the same feedback capacitance, to have an input pad 212 larger than the ones of the above given document, consequently increasing the reliability of the connection of the bonding wire 213 to the pad 212, and the mechanical resistance of the pad itself.

The Applicant performed simulations of the charge preamplifier 100 made according to what is described with reference to the chip 200. Such operative simulations, performed by CAD and by numerically extracting the values of the parasitic capacitance by the Cadence "QRC Field Solver" software (electromagnetic simulation of the electric field on a circuit made by the technology CMOS 0.35 μm), have shown a reduction of the total capacitance (in some cases, to 40%) of a standard pad of 100×100 μm, with respect to the solution introduced in the above indicated prior art document.

It is observed the charge preamplifier 100 can be made by a semi-conductive material chip 200 having a n-type substrate 202, in other words having a conductivity opposite to the one above described with reference to FIG. 2. In this case, the n-type substrate 202 is, in operation, biased to the higher voltage of the chip 200. According to this implementation, the well 205 is made by a p-type doping and has a position and functionality identical to the ones described with reference to the n-type well. The electric contact between the p-type well 205 and the second interconnecting layer 210 can be made by the first contact element 208 which comprises, for example, a doped material and with a p-type conductivity. In this case, the electric insulation between the p-type well 205 and n-type substrate 202 is kept provided that the n-type substrate 202 is biased at a higher voltage than the one of the p-type well.

Moreover, a first possible variant in addition to the one hereinbefore described with reference to FIG. 2, refers to the fact the well 205, facing the pad 212, has an area of the surface 211 less than the pad 212 area. In other words, the well 205 is included in the projection area of the pad 212 on the substrate 202, however it occupies just a portion. This solution enables to obtain a feedback capacitance $C_f$ equal to fractions of the pad 212 parasitic capacitance.

According to a second variant, it is possible to provide the well 205 completely or partially outside the projection area on the substrate 202 of the pad 212. In this case, the well 205 is made in order to (at least partially) face the second interconnecting layer 210, which in turn forms the first electrode 3 of the feedback capacitor $C_f$. Such second variant can be used, for example, if the desired feedback capacitance $C_f$ has the same value of the parasitic capacitance present in the second interconnecting layer 210 (e.g. having a value not greater than 2 fF).

Figure 3:
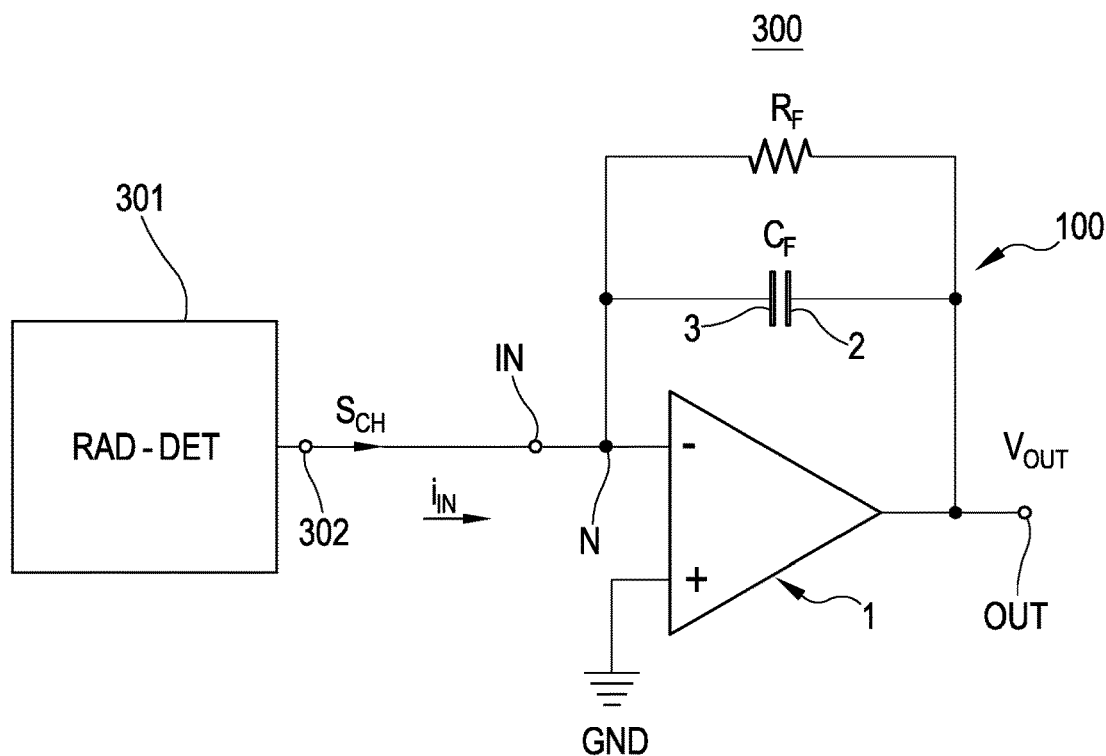
FIG. 3 schematically shows a detecting apparatus comprising a radiation sensor and said charge preamplifier.

FIG. 3 shows a detecting apparatus 300 comprising a radiation sensor 301 (RAD-DET) and the charge preamplifier 100. A sensor output 302 of the radiation sensor 301 is connected to the input IN of the charge preamplifier 100 and consequently is connected to the bonding wire 213 shown in FIG. 2.

The radiation sensor 301, if hit by an electromagnetic radiation, generates a charge signal $S_{CH}$ proportional to the energy of the absorbed radiation. The charge preamplifier 100 receives, at the input IN, this charge signal $S_{CH}$ and converts it into a voltage signal $v_{OUT}$. Such voltage signal your can be used by further processing stages in order to generate, for example, an energy spectrum and/or a radiation time distribution.

As an example, the radiation sensor 301 can be a detector of the Semiconductor (or Silicon) Drift Detector (SDD) type or of the Pixel Detector type. Such types of detectors require charge preamplifiers having a very low input capacitance in order to have the greatest performance in terms of signal/noise ratio, response speed and time stability. Typically, the charge amount generated by the detectors, for example for X or gamma rays, is extremely limited (from few hundreds to few tenths of thousands of electrons). The hereinbefore described charge preamplifier 100 is particularly adapted to be used in the detecting apparatus 200 due to the offered performance enabling to increase the energy or time resolution of the detecting apparatus itself.

The detecting apparatus 300 can be used for scientific type applications such as for example: nuclear physics and particles instrumentation (synchrotrons, accelerators, etc.); astrophysics instrumentation; medical and chemical instrumentation for radiographs and spectroscopies. Further, the detecting apparatus 300 can be used for industrial-type applications such as, for example: controlling the manufacturing of food for identifying contaminants; safety and control for the detection of explosives and explosive precursors; analysis of materials by X-Ray Fluorescence (XRF).

It is well to remember the charge preamplifier 100 enables, contrary to the prior art, to increase the available area on the pad 212 for connecting it to the bonding wire, enabling also connections formed by plural bonding wires, and does not only increase the reliability and lifetime of the detecting apparatus 300 but also enables it to operate in environments subjected to strong mechanical vibrations. Such improvement is particularly useful in astrophysics and space applications, where the step of launching satellites and probes, and possibly of landing rovers, subjects the scientific instrumentation to strong vibrations and mechanical stresses.

It is observed, as partially already said, that the described charge preamplifier 100 enables to obtain the following advantages:

reduction of the equivalent noise charge (ENC) of the preamplifier 100, as a consequence of the decrease of the input capacitance $C_{in}$, and a consequent improvement of the energy or time resolution of the measuring system in which the preamplifier is inserted;

an increase of the feedback loop gain of the preamplifier 100 and consequently an increase of the time stability of the transformation gain;

an increase, for the same feedback capacitance $C_f$, of the response speed of the preamplifier 100 for reducing the ascent/descent times of the preamplifier itself as a response to an input signal;

an increase, for the same dimensions of the input pad 212, of the closed loop transformation gain of the preamplifier 100 and a consequent decrease of the noise produced by the following stages of the processing chain;

an increase, for the same feedback capacitance $C_f$, of the area or number of metallizations of the input pad 212 and consequently an increase of the reliability of the bonding wire 212 fixed to the pad 212 and an increase of the mechanical strength of the pad itself;

a decrease of the noise, through the parasitic capacitance of the pad 212 towards the substrate 212, injected by the voltage fluctuations of the substrate itself towards the input IN of the preamplifier 100, due to the shielding offered by the well 205, piloted by the low output impedance of the amplifier 1.

LIST OF THE NUMBERS IN THE DRAWINGS charge preamplifier 100
operational amplifier 1
feedback capacitor $C_f$
input IN
node N
inverting terminal "−"
output terminal OUT
non-inverting terminal "+"
ground terminal GND
feedback resistor $R_f$
second electrode 2
first electrode 3
current signal $i_{IN}$
voltage signal your
semi-conductive material chip 200
first portion 201
second portion 209
semi-conductive material substrate 202
internal surface 203
well 205
electrically insulating material layer 204 first interconnecting layer 206
lateral zone 207
first contact element 208
second interconnecting layer 210
further surface 211
conductive pad 212
conductor 213
first conductive layer 214
second conductive layer 215
second contact elements 216
surface of the chip 217
diode 219
detecting apparatus 300
radiation sensor 301
sensor output 302

The invention claimed is:

1. A charge preamplifier device integrated in a chip of semiconductive material, comprising:
an input (IN) for an input signal ($i_{IN}$) and an output (OUT) for an output signal ($v_{OUT}$);
a substrate of semiconductive material doped according to a first type of conductivity;
an electrically insulating layer placed on the substrate;
a feedback capacitor ($C_f$) integrated in the chip and comprising a first electrode connected to the input (IN) and a second electrode connected to the output (OUT), wherein the first electrode comprises a pad connected to the input (IT) and integrated in the electrically insulating layer and the pad facing the doped conductive region and being separated from the doped conductive region by an interposed portion of the electrically insulating layer,
characterized in that the second electrode is formed by a doped conductive region having a second type of conductivity, opposite to the first type of conductivity, and integrated in the substrate in order to face the first electrode.

2. The charge preamplifier device according to claim 1, wherein the doped conductive region is made in the substrate in order to include a projection area defined by an orthogonal projection of the pad on the substrate and in order to extend besides said projection area.

3. The charge preamplifier device according to claim 1, further comprising: an operational amplifier (1) integrated in the chip of semiconductive material and having: an output terminal connected to said output (OUT), a first input terminal ("−") electrically connected to the first electrode (3) and a second input terminal ("+").

4. The charge preamplifier device according to claim 1, further comprising:
a first interconnecting layer integrated in said electrically insulating layer and having a first portion connected to the doped conductive region and a second portion connected to said output (OUT);
a first electric contact element interposed between said first portion of the first interconnecting layer (206) and the doped conductive region.

5. The charge preamplifier device according to claim 1, further comprising: a second interconnecting layer integrated in said electrically insulating layer and having a portion connected to the pad and a further portion connected to the first input terminal ("−") of the operational amplifier (1).

6. The charge preamplifier device according to claim 1, wherein the pad comprises at least one first conductive layer and said input (IN) is made by a bonding wire or by a bump-bonding fixed to said first conductive layer.

7. The charge preamplifier device according to claim 6, wherein the pad further comprises:
a second conductive layer integrated in the electrically insulating layer in order to face the first conductive layer;
at least one second electric contact element connecting the first conductive layer to the second conductive layer.

8. The charge preamplifier device according to claim 1, wherein
said feedback capacitor ($C_f$) has a capacitance value comprised between 1 fF-10 pF.

9. The charge preamplifier device according to claim 1, said amplifier is made according to one of the technologies selected among: CMOS technology, BiCMOS technology, BCD technology.

10. The charge preamplifier device according to claim 1, made so that a distance from said pad to said doped conductive region evaluated according to a direction orthogonal to the substrate is comprised between 1 µm and 10 µm.

11. The charge preamplifier device according to claim 1, wherein the doped conductive region has a respective surface facing the pad having an area smaller than a corresponding area of the pad.

12. The charge amplifier device according to claim 3, wherein the doped conductive region is made in the substrate in order to face at least partially an interconnecting layer integrated in said electrically insulating layer and having a portion connected to the input (IN) of the device and a further portion connected to the first input terminal ("−") of the operational amplifier (1).

13. A sensing apparatus, comprising:
a radiation sensor configured to convert an electromagnetic radiation into an electric charge signal ($S_{CH}$) to be supplied to an associated output of the radiation sensor;
a charge preamplifier device connected to the output of the radiation sensor for receiving the charge signal ($S_{CH}$) and for supplying a voltage signal ($v_{OUT}$) correlated to the electric charge signal ($S_{CH}$); and
a first electrode included in the charge amplifier device that comprises a pad connect to the input (IT) and integrated in the electrically insulating layer and the pad facing the doped conductive region and being separated from the doped conductive region by an interposed portion of the electrically insulating layer.

14. The sensing apparatus according to claim 13, wherein said radiation sensor is a sensor selected among: semiconductor drift detector, pixel detector.

* * * * *